United States Patent [19]
Norsworthy

[11] Patent Number: 5,539,405
[45] Date of Patent: Jul. 23, 1996

[54] DAC ACHIEVING MONOTONICITY WITH EQUAL SOURCES AND SHIFT ARRAY THEREFOR

[75] Inventor: John P. Norsworthy, Dallas, Tex.

[73] Assignee: Cirrus Logic, Inc., Freemont, Calif.

[21] Appl. No.: 99,835

[22] Filed: Jul. 29, 1993

[51] Int. Cl.$^6$ .................................................. H03M 1/66
[52] U.S. Cl. ............................................. 341/153; 341/144
[58] Field of Search ..................................... 341/144, 153

[56] References Cited

U.S. PATENT DOCUMENTS

| | | |
|---|---|---|
| 4,847,621 | 7/1989 | Colles . |
| 4,857,929 | 8/1989 | Katzenstein . |
| 4,899,151 | 2/1990 | Colles . |
| 4,904,922 | 2/1990 | Colles . |

OTHER PUBLICATIONS

"Session XIV: Data Acquisition and Conversion, THPM 14.6: A 60 ns Glitch–Free NMOS DAC," V. Shen, D. Hodges, 1983 IEEE International Solid–State Circuits Conference, pp. 188–189.

"An 80–MHz 8–bit CMOS D/A Converter," T. Miki, Y. Nakamura, M. Nakaya, S. Asai, Y. Akasaka, Y. Hoiba, IEEE Journal of Solid–State Circuits, vol. SC–21, No. 6, Dec. 1986, pp. 983–988.

CL–PX2070 Preliminary Data Sheet, Digital Video Processor, Oct. 1992.

CL–PX2080 Preliminary Data Sheet, MediaDAC, Dec. 1992.

*Primary Examiner*—Howard L. Williams
*Attorney, Agent, or Firm*—Fulbright & Jaworski

[57] ABSTRACT

Disclosed is a system and method for providing full monotonicity among desired sequential output values by converting a stream of sequential input signals each of which are representative of their corresponding desired output values. The disclosed invention comprises a system and method for individually translating each received signal to a unary value, the unary value being representative of a desired output value, and a system and method for selectively enabling a plurality of energy sources as a function of this unary value such that the total of any enabled energy source at any one time is proportional to this unary value. The conversion circuit uses a shifting array for controlling the energy sources.

47 Claims, 7 Drawing Sheets

ROW DECODER CIRCUIT TRUTH TABLE

| i [3:0] | O [15:0] | | | |
|---|---|---|---|---|
| 0000 | 0000 | 0000 | 0000 | 0001 |
| 0001 | 0000 | 0000 | 0000 | 0011 |
| 0010 | 0000 | 0000 | 0000 | 0111 |
| 0011 | 0000 | 0000 | 0000 | 1111 |
| 0100 | 0000 | 0000 | 0001 | 1111 |
| 0101 | 0000 | 0000 | 0011 | 1111 |
| 0110 | 0000 | 0000 | 0111 | 1111 |
| 0111 | 0000 | 0000 | 1111 | 1111 |
| 1000 | 0000 | 0001 | 1111 | 1111 |
| 1001 | 0000 | 0011 | 1111 | 1111 |
| 1010 | 0000 | 0111 | 1111 | 1111 |
| 1011 | 0000 | 1111 | 1111 | 1111 |
| 1100 | 0001 | 1111 | 1111 | 1111 |
| 1101 | 0011 | 1111 | 1111 | 1111 |
| 1110 | 0111 | 1111 | 1111 | 1111 |
| 1111 | 1111 | 1111 | 1111 | 1111 |

*FIG. 3*

COLUMN DECODER CIRCUIT TRUTH TABLE

| i [3:0] | O [15:0] | | | |
|---|---|---|---|---|
| 0000 | 0000 | 0000 | 0000 | 0000 |
| 0001 | 0000 | 0000 | 0000 | 0001 |
| 0010 | 0000 | 0000 | 0000 | 0011 |
| 0011 | 0000 | 0000 | 0000 | 0111 |
| 0100 | 0000 | 0000 | 0000 | 1111 |
| 0101 | 0000 | 0000 | 0001 | 1111 |
| 0110 | 0000 | 0000 | 0011 | 1111 |
| 0111 | 0000 | 0000 | 0111 | 1111 |
| 1000 | 0000 | 0000 | 1111 | 1111 |
| 1001 | 0000 | 0001 | 1111 | 1111 |
| 1010 | 0000 | 0011 | 1111 | 1111 |
| 1011 | 0000 | 0111 | 1111 | 1111 |
| 1100 | 0000 | 1111 | 1111 | 1111 |
| 1101 | 0001 | 1111 | 1111 | 1111 |
| 1110 | 0011 | 1111 | 1111 | 1111 |
| 1111 | 0111 | 1111 | 1111 | 1111 |

*FIG. 5*

| i [0:7] | O [0:7] |
|---------|---------|
| 000 | 0 |
| 001 | 1 |
| 010 | 2 |
| 011 | 3 |
| 100 | 4 |
| 101 | 5 |
| 110 | 6 |
| 111 | 7 |

CURRENT SOURCE CONTROL CHART

| # OF SOURCES ON | MSB ROW<br>15 14 13 12 11 10 9 8 7 6 5 4 3 2 1 0 | LSB COLUMN<br>15 14 13 12 11 10 9 8 7 6 5 4 3 2 1 0 |
|---|---|---|
| ROW 0: 1 | 0 0 0 0 0 0 0 0 0 0 0 0 0 0 0 1 | 0 0 0 0 0 0 0 0 0 0 0 0 0 0 0 1 |
| 2 | 0 0 0 0 0 0 0 0 0 0 0 0 0 0 0 1 | 0 0 0 0 0 0 0 0 0 0 0 0 0 0 1 1 |
| 3 | 0 0 0 0 0 0 0 0 0 0 0 0 0 0 0 1 | 0 0 0 0 0 0 0 0 0 0 0 0 0 1 1 1 |
| 4 | 0 0 0 0 0 0 0 0 0 0 0 0 0 0 0 1 | 0 0 0 0 0 0 0 0 0 0 0 0 1 1 1 1 |
| 5 | 0 0 0 0 0 0 0 0 0 0 0 0 0 0 0 1 | 0 0 0 0 0 0 0 0 0 0 0 1 1 1 1 1 |
| 6 | 0 0 0 0 0 0 0 0 0 0 0 0 0 0 0 1 | 0 0 0 0 0 0 0 0 0 0 1 1 1 1 1 1 |
| 7 | 0 0 0 0 0 0 0 0 0 0 0 0 0 0 0 1 | 0 0 0 0 0 0 0 0 0 1 1 1 1 1 1 1 |
| 8 | 0 0 0 0 0 0 0 0 0 0 0 0 0 0 0 1 | 0 0 0 0 0 0 0 0 1 1 1 1 1 1 1 1 |
| 9 | 0 0 0 0 0 0 0 0 0 0 0 0 0 0 0 1 | 0 0 0 0 0 0 0 1 1 1 1 1 1 1 1 1 |
| 10 | 0 0 0 0 0 0 0 0 0 0 0 0 0 0 0 1 | 0 0 0 0 0 0 1 1 1 1 1 1 1 1 1 1 |
| 11 | 0 0 0 0 0 0 0 0 0 0 0 0 0 0 0 1 | 0 0 0 0 0 1 1 1 1 1 1 1 1 1 1 1 |
| 12 | 0 0 0 0 0 0 0 0 0 0 0 0 0 0 0 1 | 0 0 0 0 1 1 1 1 1 1 1 1 1 1 1 1 |
| 13 | 0 0 0 0 0 0 0 0 0 0 0 0 0 0 0 1 | 0 0 0 1 1 1 1 1 1 1 1 1 1 1 1 1 |
| 14 | 0 0 0 0 0 0 0 0 0 0 0 0 0 0 0 1 | 0 0 1 1 1 1 1 1 1 1 1 1 1 1 1 1 |
| 15 | 0 0 0 0 0 0 0 0 0 0 0 0 0 0 0 1 | 0 1 1 1 1 1 1 1 1 1 1 1 1 1 1 1 |
| 16 | 0 0 0 0 0 0 0 0 0 0 0 0 0 0 0 1 | 1 1 1 1 1 1 1 1 1 1 1 1 1 1 1 1 |
| ROW 1: 17 | 0 0 0 0 0 0 0 0 0 0 0 0 0 0 1 1 | 0 0 0 0 0 0 0 0 0 0 0 0 0 0 0 1 |
| 18 | 0 0 0 0 0 0 0 0 0 0 0 0 0 0 1 1 | 0 0 0 0 0 0 0 0 0 0 0 0 0 0 1 1 |
| 19 | 0 0 0 0 0 0 0 0 0 0 0 0 0 0 1 1 | 0 0 0 0 0 0 0 0 0 0 0 0 0 1 1 1 |
| 20 | 0 0 0 0 0 0 0 0 0 0 0 0 0 0 1 1 | 0 0 0 0 0 0 0 0 0 0 0 0 1 1 1 1 |
| 21 | 0 0 0 0 0 0 0 0 0 0 0 0 0 0 1 1 | 0 0 0 0 0 0 0 0 0 0 0 1 1 1 1 1 |
| 22 | 0 0 0 0 0 0 0 0 0 0 0 0 0 0 1 1 | 0 0 0 0 0 0 0 0 0 0 1 1 1 1 1 1 |
| 23 | 0 0 0 0 0 0 0 0 0 0 0 0 0 0 1 1 | 0 0 0 0 0 0 0 0 0 1 1 1 1 1 1 1 |
| 24 | 0 0 0 0 0 0 0 0 0 0 0 0 0 0 1 1 | 0 0 0 0 0 0 0 0 1 1 1 1 1 1 1 1 |
| 25 | 0 0 0 0 0 0 0 0 0 0 0 0 0 0 1 1 | 0 0 0 0 0 0 0 1 1 1 1 1 1 1 1 1 |
| 26 | 0 0 0 0 0 0 0 0 0 0 0 0 0 0 1 1 | 0 0 0 0 0 0 1 1 1 1 1 1 1 1 1 1 |
| 27 | 0 0 0 0 0 0 0 0 0 0 0 0 0 0 1 1 | 0 0 0 0 0 1 1 1 1 1 1 1 1 1 1 1 |
| 28 | 0 0 0 0 0 0 0 0 0 0 0 0 0 0 1 1 | 0 0 0 0 1 1 1 1 1 1 1 1 1 1 1 1 |
| 29 | 0 0 0 0 0 0 0 0 0 0 0 0 0 0 1 1 | 0 0 0 1 1 1 1 1 1 1 1 1 1 1 1 1 |
| 30 | 0 0 0 0 0 0 0 0 0 0 0 0 0 0 1 1 | 0 0 1 1 1 1 1 1 1 1 1 1 1 1 1 1 |
| 31 | 0 0 0 0 0 0 0 0 0 0 0 0 0 0 1 1 | 0 1 1 1 1 1 1 1 1 1 1 1 1 1 1 1 |
| 32 | 0 0 0 0 0 0 0 0 0 0 0 0 0 0 1 1 | 1 1 1 1 1 1 1 1 1 1 1 1 1 1 1 1 |
| ⋮ | ⋮ | ⋮ |
| ROW 15: 241 | 1 1 1 1 1 1 1 1 1 1 1 1 1 1 1 1 | 0 0 0 0 0 0 0 0 0 0 0 0 0 0 0 1 |
| 242 | 1 1 1 1 1 1 1 1 1 1 1 1 1 1 1 1 | 0 0 0 0 0 0 0 0 0 0 0 0 0 0 1 1 |
| 243 | 1 1 1 1 1 1 1 1 1 1 1 1 1 1 1 1 | 0 0 0 0 0 0 0 0 0 0 0 0 0 1 1 1 |
| 244 | 1 1 1 1 1 1 1 1 1 1 1 1 1 1 1 1 | 0 0 0 0 0 0 0 0 0 0 0 0 1 1 1 1 |
| 245 | 1 1 1 1 1 1 1 1 1 1 1 1 1 1 1 1 | 0 0 0 0 0 0 0 0 0 0 0 1 1 1 1 1 |
| 246 | 1 1 1 1 1 1 1 1 1 1 1 1 1 1 1 1 | 0 0 0 0 0 0 0 0 0 0 1 1 1 1 1 1 |
| 247 | 1 1 1 1 1 1 1 1 1 1 1 1 1 1 1 1 | 0 0 0 0 0 0 0 0 0 1 1 1 1 1 1 1 |
| 248 | 1 1 1 1 1 1 1 1 1 1 1 1 1 1 1 1 | 0 0 0 0 0 0 0 0 1 1 1 1 1 1 1 1 |
| 249 | 1 1 1 1 1 1 1 1 1 1 1 1 1 1 1 1 | 0 0 0 0 0 0 0 1 1 1 1 1 1 1 1 1 |
| 250 | 1 1 1 1 1 1 1 1 1 1 1 1 1 1 1 1 | 0 0 0 0 0 0 1 1 1 1 1 1 1 1 1 1 |
| 251 | 1 1 1 1 1 1 1 1 1 1 1 1 1 1 1 1 | 0 0 0 0 0 1 1 1 1 1 1 1 1 1 1 1 |
| 252 | 1 1 1 1 1 1 1 1 1 1 1 1 1 1 1 1 | 0 0 0 0 1 1 1 1 1 1 1 1 1 1 1 1 |
| 253 | 1 1 1 1 1 1 1 1 1 1 1 1 1 1 1 1 | 0 0 0 1 1 1 1 1 1 1 1 1 1 1 1 1 |
| 254 | 1 1 1 1 1 1 1 1 1 1 1 1 1 1 1 1 | 0 0 1 1 1 1 1 1 1 1 1 1 1 1 1 1 |
| 255 | 1 1 1 1 1 1 1 1 1 1 1 1 1 1 1 1 | 0 1 1 1 1 1 1 1 1 1 1 1 1 1 1 1 |
| 256 | 1 1 1 1 1 1 1 1 1 1 1 1 1 1 1 1 | 1 1 1 1 1 1 1 1 1 1 1 1 1 1 1 1 |

*FIG. 8*

DAC ACHIEVING MONOTONICITY WITH EQUAL SOURCES AND SHIFT ARRAY THEREFOR

CROSS REFERENCE

Co-pending patent application entitled "A Voltage Reference and Current Source for Video DAC," Ser. No. 08/099, 158, now U.S. Pat. No. 5,410,311, filed concurrently herewith and assigned to a common assignee is hereby incorporated by reference herein.

TECHNICAL FIELD OF THE INVENTION

The present invention relates in general to the conversion of received signals, and, more specifically, to conversion circuits which provide full monotonicity.

BACKGROUND OF THE INVENTION

Although sheer "number crunching" is an important application of digital electronics, the real power of digital techniques is seen when digital methods are applied to analog (or linear) signals and processes.

The ability to efficiently and effectively combine and convert signals among several different formats enables the combining of analog and digital techniques to provide powerful solutions to many challenging problems, the significance of which can most clearly be seen when bringing digital signals on and off circuit boards, in and out of instruments, and through cables.

It is often necessary to convert an analog signal to an accurate digital number proportional to its amplitude, and vice versa. Such a conversion is essential in any application in which a computer or other processor driven system is responsible for logging or controlling experimental processes, or where digital techniques are used to perform "normal" analog tasks.

An example of a "normal" analog task would be an application in which analog information is converted to an intermediate digital format for error and noise free transmission, such as "digital audio" or "pulse code modulation" (PCM) applications.

A second example would be the establishment of an output power source (such as a voltage or current level) as a function of an input signal. This is especially important where a video signal is controlled by an analog or digital input voltage level.

A wide variety of measurement instruments, including ordinary bench instruments, such as digital multimeters, and more exotic instruments, such as transient averagers, "glitch catchers," and digital memory oscilloscopes, as well as signal-generation and processing instruments, such as digital waveform synthesizers and data encryption devices, also make significant use of analog to digital and digital to analog conversion.

Two popular methods for converting digital to analog signals exist. The first method uses scaled, or binary weighted, resistors coupled with a summing junction, while the second uses an R-2R ladder (a resistor and signal source network which generates binary scaled signals). In either case, the circuit accepts an n-bit digital word and produces an analog signal. Neither is the preferred method, and the decision as to which method to implement most often turns upon the application involved.

The advantage of the scaled resistor technique is its speed. Its drawbacks, however, are (1) that the conversion is not precise; and (2) in circumstances when more than a few bits of information are to be converted, the implementation becomes awkward and cumbersome. For example, in a 12-bit converter circuit, a range of resistor values of 2000:1 is required.

The R-2R ladder technique, on the other hand, provides an elegant solution in that only two resistor values are required regardless of the number of bits of information to be converted. Thus, the advantages of the R-2R ladder are that (1) the implementation is simplified by limiting the range of resistor values to two; and (2) the implementation is considered precise. The disadvantage of the R-2R ladder technique is that this implementation is considered slow.

In the area of analog to digital conversion, there are approximately a half dozen techniques for converting analog signals to an equivalent digital format. As was the case with digital to analog converters, each technique has its own peculiar advantages and limitations. Similarly, as with digital to analog conversion, there exists an implementation decision which turns largely upon a trade-off between speed and precision.

In addition, all of the previously discussed conversion techniques are incapable of guaranteeing full monotonicity as a particular conversion technique processes sequential signals. Full monotonic conversion is the conversion of input signals such that as adjacent input signals change in value, output signal "glitches" are nonexistent. Such a "glitch" would be present, for example, in a presently available output voltage control system where the output voltage does not always transition between adjacent signals in the same direction as the change in value of the input signal. For example, a "glitch" may occur in an output signal emanating from a converter when an increase from one input signal to the subsequent input signal results in the output signal first decreasing to a reference level in-between the adjacent input signals before the output signal increases to correspond to the new increased input signal. Furthermore, "glitches" may cause a "flash" to occur on a video monitor, a "flash" being the surge seen on a video monitor displaying an analog signal non-monotonically converted from a digital base.

Thus, the need for such a monotonic conversion technique is an essential ingredient for the generation of analog displays by digital instrument, e.g., a meter indication or XY display (or plot) created by a computer, or more particularly in real-time video processing.

Therefore, there exists a need in the art for a system and method for converting signals received in a first format to a second format which is both efficient and highly accurate, e.g., fast and precise.

There exists a further need in the art for a system and method for converting subsequently received signals such that changes in adjacent signals' values are monotonic, thus eliminating both "flashes" and "glitches."

There exists a still further need in the art for a system and method for converting sequentially received signals which may be compactly, or densely, implemented within an integrated circuit structure.

There is a still further need in the art for a means by which to convert signals received in a first format to a second format which is both accurate and fast, and is not restrained by the size of the signal received in the first format.

SUMMARY OF THE INVENTION

These and other needs and features are achieved by the present invention in which a circuit converts a stream of sequential input signals, each such individual input signal being representative of a desired output value. The circuit translates each of the sequential input signals to a derived unary value which is in fact, representative of the desired output value. The conversion is accomplished by a shifting array which operates to decode the input binary value and to create unary values which drive a current control matrix. In one embodiment, the circuit enables a particular number of current sources as a function of the unary number such that the total number of enabled current sources is equivalent to the derived unary value.

In the preferred embodiment, the power sources are arranged in a multidimensional array. The multidimensional array can be adapted for reducing the complexity associated with the conversion from the first received format to the second desired format. The array additionally provides for converting the input signals in a manner which is fast, precise and dense. Single transistor multiplexers are used in a shifting array and connected in common to a derived input value. The shifting array is preset to achieve the desired output value which then controls the current matrix. The circuit guarantees monotonic transitions between adjacent signals such that signals received in a first format enable power source transitions or fluctuations between values of adjacent sequential signals in direct proportion to the changes in value of the respective derived unary values.

In the preferred embodiment, transitions between adjacent signals result in increasing or decreasing the total number of enabled power sources of the preceding signal as a function of the change between the unary value of the preceding signal and the unary value of the present signal. The preferred embodiment guarantees the elimination of both "flashes" and "glitches."

Therefore, a technical advantage of the present invention is that the sources are arranged in a multidimensional array structure which operates from a unary value generated by use of a shift logic and which reduces the complexity associated with decoding the input signal.

A further technical advantage is that the implementation of the present invention is fast, dense and reliable and allows for easy sealing of outputs.

Another technical advantage is that the use of an intermediate unary value to drive the output source guarantees full monotonicity.

A further technical advantage of the present invention is the reduced physical area required, speed of operation and ease of integration into existing data processing structures.

A still further technical advantage is that the design of the present invention allows both reduction and expansion of the implementation to meet particular needs without a loss in performance or precision.

The foregoing has outlined rather broadly the features and technical advantages of the present invention so the detailed description of the invention that follows may be better understood. Additional features and advantages of the invention will be described hereinafter which form the subject of the claims of the invention. Those skilled in the art should appreciate that the conception and the specific embodiment disclosed may be readily utilized as a basis for modifying or designing other structures for carrying out the same purposes of the present invention. Those skilled in the art should also understand that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3 and 5 illustrate truth tables describing the decoder circuits of FIGS. 2 and 4;

FIG. 8 is a chart of unary controlled current sources; and

DETAILED DESCRIPTION OF THE INVENTION

Figures 6, 7:
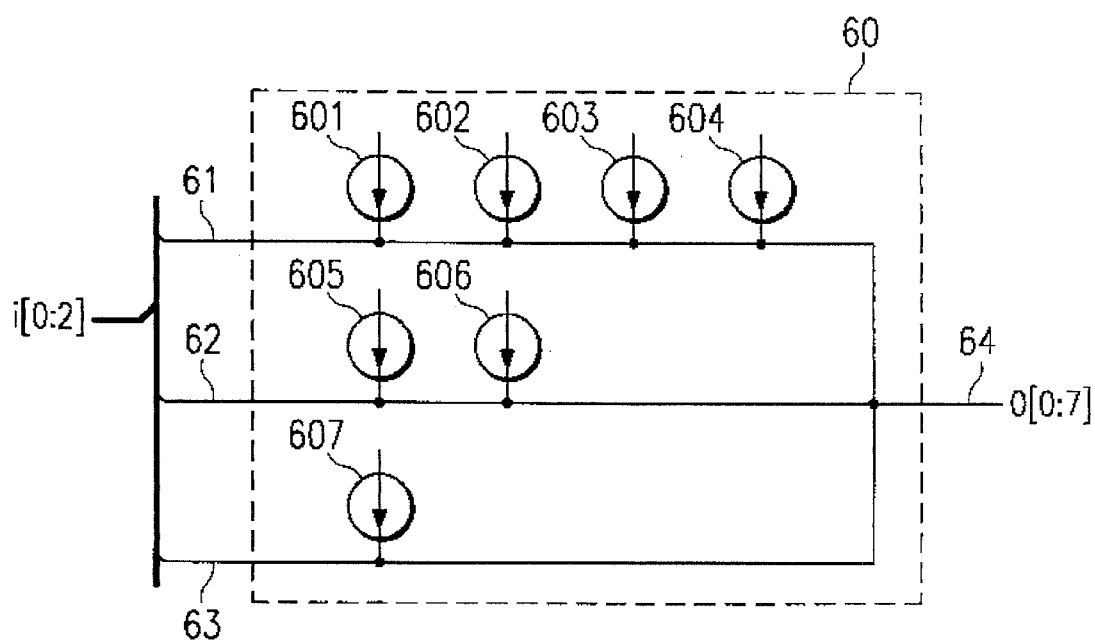
FIG. 6 illustrates a schematic diagram of a typical digital to analog converter circuit ("DAC") available in the prior art.
FIG. 7 illustrates a truth table describing the DAC of FIG. 6.

Referring to FIG. 6, there is illustrated a schematic diagram of a typical DAC circuit available in the prior art. DAC 60 is shown to highlight the particular problems to which the claimed invention is directed. For the purposes of illustration only, DAC 60 is shown to have three input lines 61, 62 and 63, and single output line 64.

Coupled to each of input lines 61–63 are a number of current sources. Four current sources 601, 602, 603 and 604 are coupled to input line 61, two current sources 605 and 606 are coupled to input line 62, and single current source 607 is coupled to input line 63. Input line 61 is representative of the most significant bit ("MSB") of the 3-bit digital input signal ("i(0:2)") entering DAC 60. DAC 60, as stated previously, is a 3-bit DAC, and is therefore capable of producing eight output values ("o(0:7)") through output line 64, the transition from one input value to another being illustrated by the truth table of FIG. 7.

A better understanding of the present problem to which the claimed invention is directed is best illustrated by "walking through" several of the DAC 60 output states. Beginning with a digital input of zero, "000," all of the current sources, 601–607, are inactive. Increasing the digital input value to one, "001,"0 activates current source 607 which drives an output signal equal to one. Increasing the digital input value by one to two, "010," causes the deactivation of current source 607 and the activation of current sources 605 and 606 which drive an output signal equal to two through output line 64.

Note that during this transition, from input value "001" to "010," there is a brief period during which a "glitch" occurs (the "glitch" being the energy disturbance associated with a change in value). This "glitch" is caused by the deactivation of one set of current sources (607) and the nearly simultaneous activation of a separate set of current sources (605, 606).

For DAC 60, similar scenarios also occur during transitions from a digital input value of three, "011," to four, "100," and from a digital input value of five, "101," to six, "110."

As can be readily appreciated, a DAC employing a larger digital input value, such as an 8-bit DAC, which can support up to 256 possible output values, substantially increases the probability that a disturbance will occur.

Where precision and/or speed are desired, "glitches" are unacceptable, and there is therefore a strong desire to eliminate "glitch" disturbances. In the area of real-time video processing, for example, "glitch" disturbances will severely affect output display (providing "flashes," for example) and are thus unacceptable. As stated previously, the claimed invention is directed to the elimination of this problem.

Also, note that if the various transistors of circuit 60 are not properly calibrated, it could be possible to have the voltage level on output 64 actually lower in the "two" state (transistors 605 and 606 activated) than it would be in the "one" state (transistor 607 activated). Under this situation circuit 60 would not be fully monotonic.

Conversion circuits similar to the one described herein are shown in U.S. Pat. No. 4,857,929 dated Aug. 15, 1989, U.S. Pat. No. 4,904,922 dated Feb. 27, 1990, U.S. Pat. No. 4,899,151 dated Feb. 6, 1990 and U.S. Pat. No. 4,847,621 dated Jul. 11, 1989 and in articles appearing in the IEEE Journal of Solid State Circuits, Vol. SC-21, No. 6, December 1986, and in 1983 IEEE International Solid State Circuits Conference.

Figure 1:
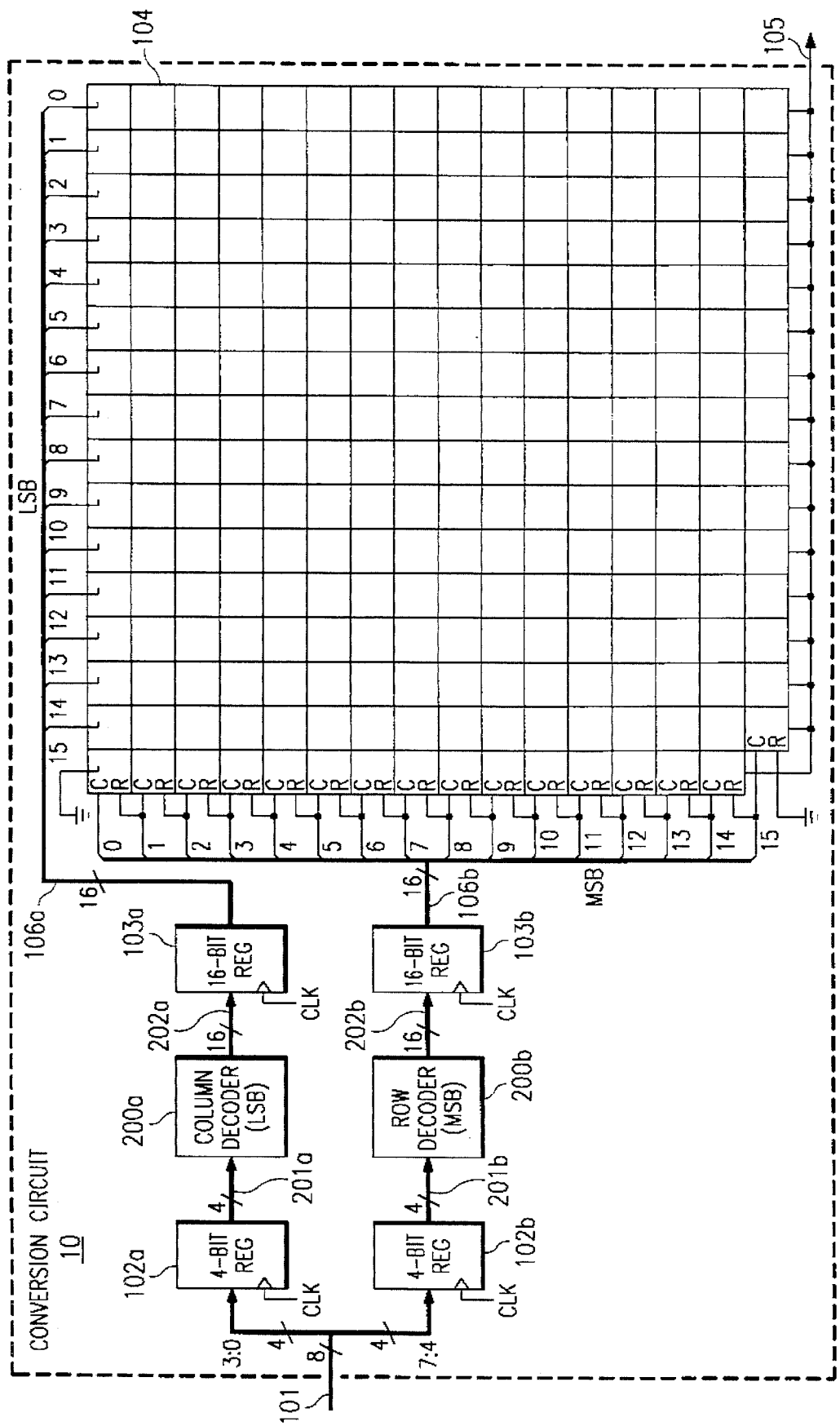
FIG. 1 illustrates a schematic diagram of a conversion circuit.

Turning now to FIG. 1, there is illustrated a schematic diagram of conversion circuit 10. In the preferred embodiment, conversion circuit 10 receives a digital input signal on input lead 101 and drives an analog output signal on lead 105. In the illustrated example, the digital input signal is eight bits wide and feeds two 4-bit registers 102a, 102b. Both registers 102a and 102b are clocked.

Each 4-bit register 102a, 102b is coupled to four to 16-bit decoder circuit 200a, 200b via bus lines 201a, 201b, respectively. Each decoder 200a, 200b translates a received 4-bit input value to an intermediate unary value which, when coupled with the unary value from the other decoder, creates a new unary value which is representative of the desired number of output devices which are to be activated to provide a desired current level over output line 105. Decoder circuits 200a, 200b will be described in greater detail in connection with FIGS. 2, 3, 4 and 5.

In the preferred embodiment, each of decoder circuits 200a, 200b is coupled to 16-bit clocked registers 103a and 103b, respectively. Register 103a controls the columns of multi-dimensional array 104 via bus 106a, while register 103b controls the rows of multi-dimensional array 104 via bus 106b.

Array 104 is a matrix of current sources, such as depicted in FIG. 6, operating such that the entire row of sources (such as sources 0-15 to 0-0) will be "on" (enabled) if the R lead for that row is high (on). Thus, if lead 1 of MSB cable 106b is high the entire "R" row would be "on." In addition, if both the C input to a row and the L input to a column are "on" then the current source at the intersection between them will be "on." The current sources are not shown in FIG. 1 for simplicity of illustration.

Array 104 operates such that lead 105 sums all of the "on" current sources throughout array 104. Array 104 further operates such that the "ones" from the MSB control the row current sources in a manner such that array 104 works from top right (current source 0-0) across the row to the left to current source 0-15 as the unary number increases.

Upon receipt of an initial clock pulse, a first digital input signal is sent to circuit 10 over input line 101. This digital input signal may represent an intensity of a particular color of a video signal (e.g., red, green or blue). This input signal, being eight bits wide is divided into two 4-bit signals, with the first four bits received by register 102a, and the second four bits (which represent the most significant bits ("MSB") of the 8-bit input) received by register 102b. This splitting of the input signal allows for parallel processing, which in turn promotes high speed operation.

The conversion from an 8-bit input signal to a single unary number which controls the output current is accomplished in two stages. The first stage is the conversion into two unary numbers, one such unary number representative of the most significant bits (MSB) of the input signal and the second unary number representative of the least significant bits (LSB) of that same input signal.

As can be seen from the row and column decoder circuit truth tables in FIGS. 3 and 5, when this is accomplished, the "ones" value increases by one for each number from 1 through 15. Thus, the number "3" would have three ones while the number "5" would have five ones and the number "12" would have twelve ones. It is these "ones," as will be seen, that control and drive current source matrix 104 such that matrix 104 supplies an output through lead 105 that is monotonic across the entire input signal range.

As shown in FIG. 1, the MSB unary value drives the rows of matrix 104 while the LSB unary value drives the columns. Matrix 104 is arranged, as will be seen, to fill in from the top right current source 0-0, across the top row to the top left current source 0-15 and then continues in the next row (row 1) at the right-most current source 1-0 across to current source 1-15 and so forth down to the highest current source 15-14. Note that all of the current sources are equal in this embodiment and thus the output will be linear. Of course, the current sources could be arranged in a mathematical progression to yield outputs which, for example, could be geometric or logarithmic.

As discussed, current matrix 104 is controlled such that the R lead for a particular row maintains activation of that row regardless of the status of the C and L leads. Thus, as illustrated in FIG. 8, as the unary value of the row (MSB) increases, the preceding rows all remain on. For example, for the values between 1 and 16 the unary value of the MSB is "1"; thus, a "high" is only on the row (MSB) 0 lead, which, as shown in FIG. 1, is connected only to the "C" input of row 0. Since there is not a "high" bit entering on row (MSB) 1, there is not a "high" bit entering the R lead of row (MSB) 0. As a result, the current sources of row 0 are under the control of column bits (LSB) entering from bus 106a.

For unary numbers between 17 and 33, the current sources of row 0 are permanently activated (as controlled by lead 1 having a "1", or "high", thereon). This "high" on lead 1 is provided to input C of row 1 and to input R of row 0. The "high" on input R causes all of the current sources of row 0 to be activated.

Assume for purposes of illustration that the input signal from the 8-bit input (lead 101) is the number 5. The MSB will have a "1" in row 0 and the LSB would have ones in columns 1, 2, 3 and 4. Thus, a "high" would be on MSB lead 0 going to row 0 control input C. A "high" would also be on LSB leads 0 through 4 going to the L inputs of columns 0 though 4. Accordingly, current sources 0-0, 0-1, 0-2, 0-3, and 0-4 would be activated and the output on lead 105 would be the sum of these current sources.

If the input signal on input lead 101 were to then change to the number 6, note that the only change in the MSB and LSB would be that an additional "high" would appear on LSB lead 5, thereby activating current source 0-5 and increasing the output value on lead 105 by exactly one current source value. As the input value increases the output value increases by exactly one current source for each one digit change in the input value until, in the present example, the input number 15 is reached which corresponds to the left-most current source in the top row of matrix 104.

Assume that the next input signal value is then 16. Then the MSB 0 turns to 1 (high) and all of the current sources in row 0 are activated regardless of their LSB value. At the same time MSB lead 1 begins to control row 1 via lead C of row 1. Thus, when LSB lead 0 becomes "high", as it would for the number 16, the next current source (1-0) is activated. This current source, coupled with the current sources 0-0 through 0-15 which are activated by the "high" on MSB lead 0 input R, provides a "16-current" source output to lead 105. As discussed, the unary output on the MSB leads serves to hold the preceding row current sources in their activated state insuring that the output is smooth, "glitch free," and fully monotonic.

As shown for matrix 104 in FIG. 1, if it is desired to have an output signal equal to a particular value then all of the current sources that precede that value will be activated, in addition to the selected value. Thus, if output current source 12-10 where to be activated then all of the current sources in rows 0 through 11 would be activated (via "highs" on MSB leads 0–11) as well as the current sources 12-0 through 12-9 (via "highs" on LSB leads 0–9).

As previously described, an initial clock pulse enters a first 8-bit input signal on lead 101 into 4-bit registers 102*a*, 102*b*. Upon receipt of a second clock edge, the values stored within 4-bit registers 102*a* and 102*b* are driven to and received by column and row decoders 200*a* and 200*b* over lines 201*a* and 201*b*, respectively. During this same clock period, a second input signal is received by registers 102*a*, 102*b* over input line 101. Thereafter, decoder circuits 200*a*, 200*b* translate the first received input signal to a unary value. This unary value is representative of the desired output value which will eventually be driven over output line 105. Following the translation, the unary values derived by column and row decoders 200*a*, 200*b* are driven over their respective bus lines 202*a* and 202*b* and are received by 16-bit clocked registers 102*a*, 103*b*, respectively.

Upon receipt of a third clock edge, the values stored within 16-bit registers 103*a*, 103*b* are released. The unary values stored in each 16-bit register 103*a*, 103*b* activate the appropriate number of current sources within multidimensional array 104. Thus, the unary values are used to selectively enable a quantity of power (current) sources such that the total enabled power source over line 105 is directly proportional to the derived unary values.

Also occurring during this third clock period, 4-bit registers 102*a*, 102*b* release the second received input signal to decoder circuits 200*a*, 200*b*, and now store a third received input signal.

Upon receipt of subsequent clock pulses, circuit 10 will transition between adjacently translated input signals such that changes in their respective unary values correspondingly increase or decrease the respective output values in direct proportion to the unary values.

Thus, in order to guarantee monotonicity, it is a characteristic of conversion circuit 10 to activate or deactivate the exact number of sources corresponding to the increment or decrement of the unary value relative to the preceding output value.

Thus, for an increase in unary value, the sources that were activated stay activated, while additional activated sources are added corresponding to the increase in unary value. As previously stated, this is accomplished by decoding a digital input value received on lead 101 to a unary value, and using the unary value to drive the current sources. The conversion to a unary value creates an output which contains a voltage level equal to the value of the input signal on lead 101. Because each unary value bit changes state for one and only one input value, full-monotonicity is guaranteed.

It is further desirable to organize array 104 of power sources into rows and columns, as in memory technology, so as to simplify the decoding as well as to provide for physical implementations that meet aspect ratio requirements.

Full-monotonicity can be guaranteed because as circuit 10 receives subsequent signals which are controlled by each received clock edge, the number of power sources turning on or turning off is exactly equal to the change in the value of the input signal on lead 101. For example, if the input changes from a digital value equal to 127 to a digital value equal to 128, exactly one power source changes state. Thus, "glitch" energy is minimized and the output is maintained in proportion to the change in input value.

Figure 2:
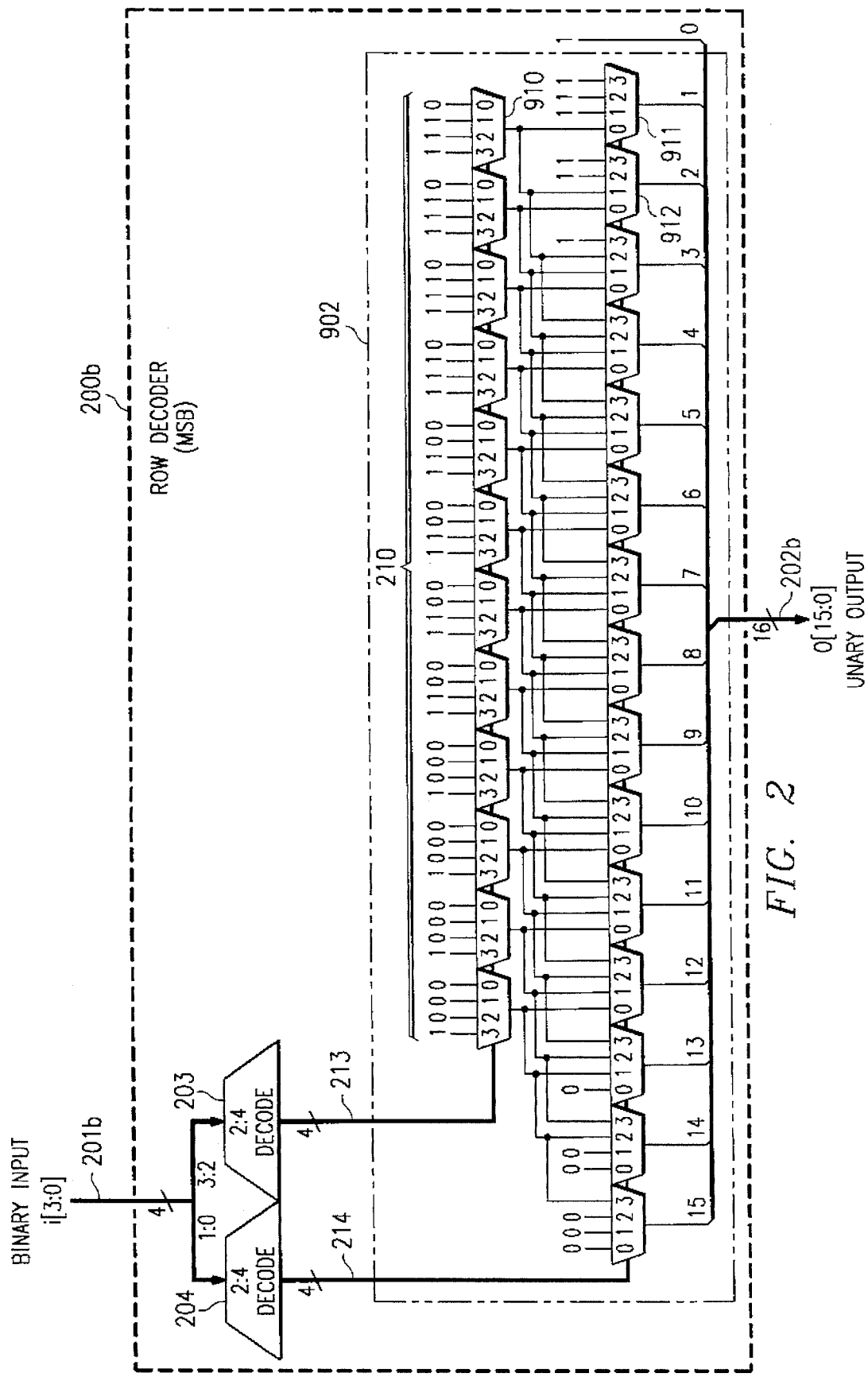
FIGS. 2 and 4 illustrate schematic diagrams of decoder circuits implemented within the architecture of FIG. 1.

Turning now to FIG. 2, illustrated is a schematic diagram of decoding circuit 200*b* implemented within the architecture of FIG. 1. A 4-bit decoder circuit is illustrated; however, depending upon the particular complexity of the implementation, other larger or smaller multi-bit decoders may be utilized.

Decoder circuit 200*b* receives a digital input value on lead 201*b*, which is four bits wide, and drives a unary output value of sixteen bits 0–15 through output line 202*b*. The input value on lead 201*b* is divided through decoder circuits 203 and 204. Both decoder circuits 203 and 204 are two to four-bit decoders. Row decoder 200*b* is designed to implement the truth table illustrated in FIG. 3.

Figure 4:
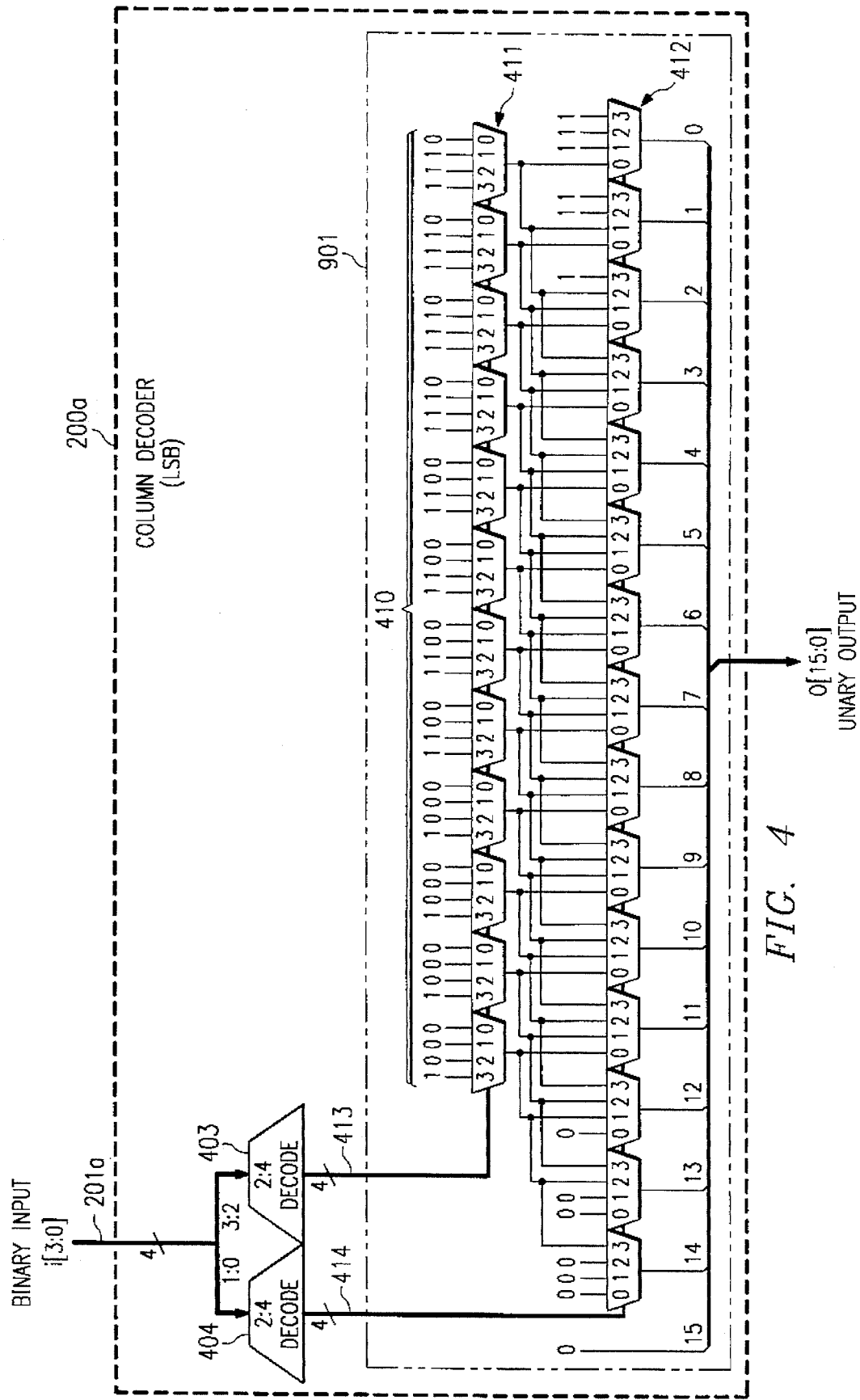

It becomes apparent that the output on lead 202*b* is equivalent to a shift left fill "1" operation, as seen in FIGS. 3 and 5. Shifters can be made to be both fast and dense. A two level shifter has been chosen, where each shifter cell is comprised in the preferred embodiment of 8 n-channel transistors and an inverter, the implementation of which is highly structured. The truth tables of FIGS. 3 and 5 are established by hard wiring the inputs 210 and 410 of the shifting structures to high and low voltages as shown in FIGS. 2 and 4. Multiplexers 411 and 412 (FIG. 4) are each a series of 4 to 1 multiplexers with common control lines 413 and 414, respectively. Each control line, 413 or 414, has 4 bits which drives either the row or column of the current (power) source array in the manner shown by the chart shown on FIG. 8.

In an analogous manner, column decoder 200*a* detailed in FIG. 4 is designed to implement the truth table illustrated in FIG. 5.

Figure 9:
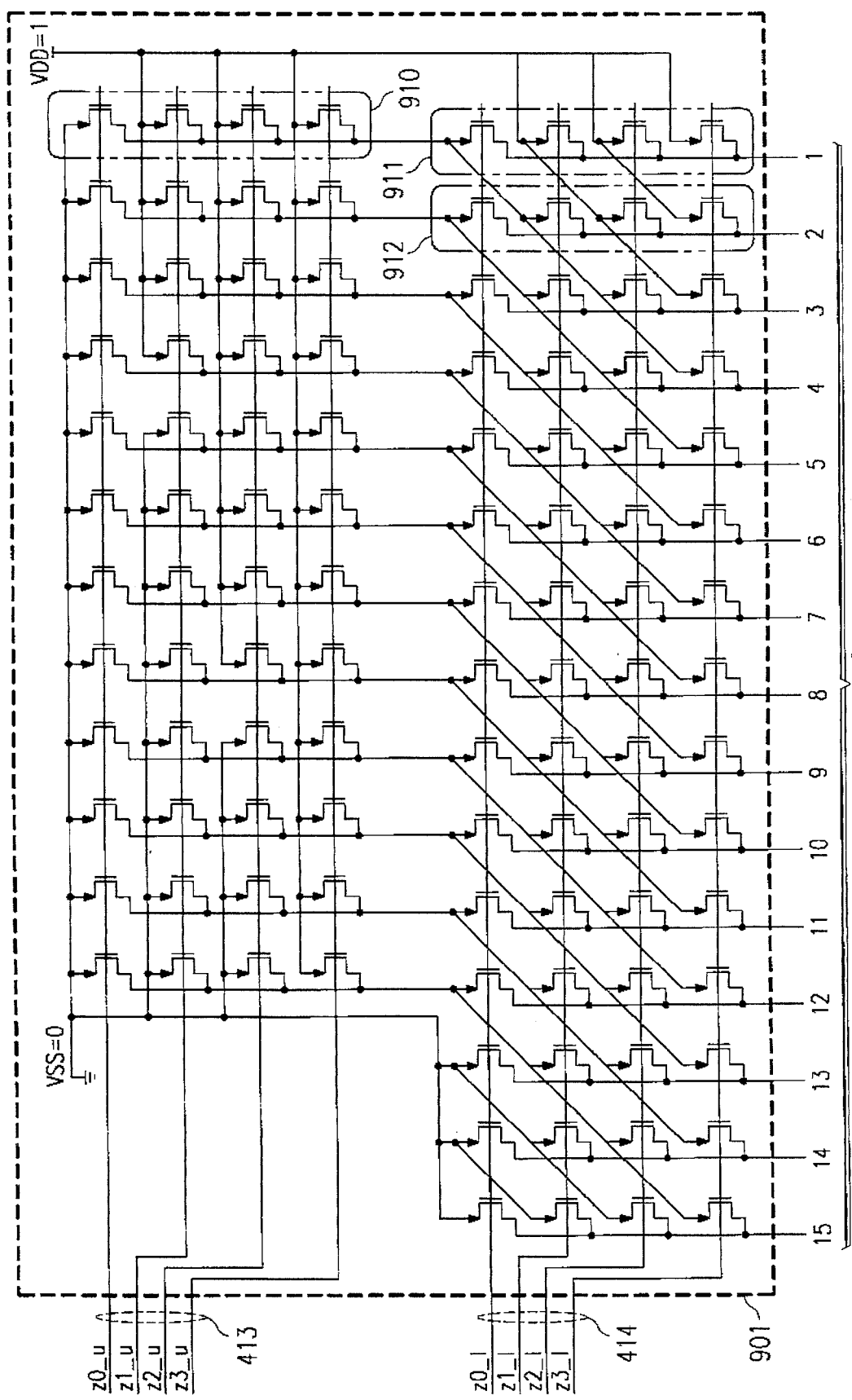
FIG. 9 shows one embodiment of the binary to unary shift circuit.

One advantage to the shifting array is that each multiplexer is four transistors having four inputs for control and four inputs for data. This configuration is shown in FIG. 9, where circuit 901 is the shifting array shown in FIG. 4, where two multiplexers 910 and 911 have been outlined. The only difference between array 901 (FIG. 4) and array 902 (FIG. 2) is that the output leads have been redesignated because they have been shifted by one. In array 901, output 15 contains a permanent 0 or low voltage while array 902, output 0 contains a permanent 1 or high voltage. Also, these decoders are readily extendable to higher orders without substantially increasing performance.

Though, the present invention has been described with reference to a DAC, it is applicable to any system wherein a monotonic conversion from one signal to another is beneficial. Additionally, when applied to the processing of the video signals, the present invention is applicable to any and all video-related systems, e.g., computers, television transmissions, videophones, etc.

Although the present invention and its advantages have been described in detail, it should be understood that various changes, substitutions and alterations can be made herein without departing from the spirit and scope of the invention as defined by the appended claims.

What is claimed is:

1. A circuit for providing a monotonic output signal as a function of an input signal value, said circuit comprising:

means for dividing said input signal into a plurality of unary valued control signals, each of said unary valued control signals containing a plurality of binary bits, a combination of said bits of each of said unary control signals operable for controlling said output signal;

means, including a plurality of energy providing sources, for establishing said output signal under control of combinations of said plurality of unary valued control signals; and wherein said dividing means includes means controlled by said input signals for shifting left and filling with ones to achieve said unary control signals.

2. The circuit set forth in claim 1 wherein said energy providing sources are arranged in a matrix, and wherein one of said unary valued control signals controls rows of said matrix and another of said unary valued control signals controls columns of said matrix, and wherein the number of energy providing sources that are enabled at any one time are controlled by a combination of said row and column control signals.

3. The circuit set forth in claim 2 wherein said one of said unary valued control signals represents MSB bits of said input signal while said another of said unary valued control signals represents LSB bits of said input signal.

4. The circuit set forth in claim 3 wherein each of said row and column combination control signals is a coincident "one" condition of both a row and a column control signal and wherein said circuit further comprises:

means, controlled by said MSB representative bits of said unary valued control signals, for maintaining said energy providing sources of a certain row of said matrix in their enabled condition regardless of a status of said LSB representative bits.

5. The circuit set forth in claim 1 wherein said shifting means includes at least one shifting array having a common input responsive to said binary bits from said input signal for deriving said unary signals.

6. The circuit set forth in claim 5 wherein said energy providing sources are current sources which are added together under coincident joint control of said unary valued control signals.

7. The circuit set forth in claim 6 wherein said current sources are equal in value to each other.

8. The circuit set forth in claim 1 wherein said energy providing sources are equal in value to each other.

9. The circuit set forth in claim 1 wherein said energy providing sources are added together under coincident joint control of said unary valued control signals.

10. A circuit for providing full monotonicity among desired sequential output values by converting a received stream of sequential input signals, said received stream of sequential input signals representative of said desired output values, said circuit comprising:

first means for dividing ones of said received stream of sequential input signals into a binary value representative of said desired output values;

means including at least one shifting array having a common input control responsive to said binary value for translating said binary value to a unary value;

means for selectively enabling a plurality of current sources as a function of said unary value such that a total sum of any enabled power sources at any one time is proportional to said unary value; and means for transitioning between changes in value of adjacently received input signals such that said total sum of any enabled power sources fluctuates in direct proportion to changes in said unary values of said adjacently received input signals.

11. The circuit as recited in claim 10 wherein said shifting array is a plurality of n-bit multiplexers each having a set of preestablished input patterns such that under selected by said common control lines the appropriate unary number appears at the output.

12. The circuit as recited in claim 10 wherein said plurality of current sources is an addressable matrix array of equally valued current sources.

13. The circuit as recited in claim 10 wherein said current sources are logarithmically related.

14. The circuit as recited in claim 10 wherein said current sources are geometrically related.

15. The circuit as recited in claim 10 wherein said input signals are digitized video signals and said output values are analog video signals.

16. The circuit as recited in claim 10, further comprising:

second means for dividing said ones of said received stream of sequential input signals into MSB bits and LSB bits, wherein said first dividing means operates on said MSB bits and said LSB bits to transform each of said bits into a MSB unary value and a LSB unary value, respectively.

17. The circuit as recited in claim 16 wherein said enabling means comprises a matrix array of said power sources configured in rows and columns, wherein said MSB unary value controls enablement of said rows and said LSB unary controls enablement of said columns.

18. The circuit as recited in claim 10 wherein said transitioning means comprises:

means for maintaining enablement of said power sources for a particular unary value during a transition from said particular unary value to a next unary value.

19. The circuit as recited in claim 18 wherein said enabling means adds/deletes a number of power sources to said total sum, wherein said number is proportional to a difference between said particular unary value and said next unary value.

20. A circuit for monotonically converting a sequence of binary input signals into a correspondingly proportional output signal, said circuit comprising:

means for converting said binary signals into unary signals, said means including a shifting array having a plurality of multiplex circuits connected in common with said binary control signals; and means for activating a plurality of energy sources, said activating means controlled by said sequence of unary valued control signals, and wherein a sum of activated energy sources is porportional to each one of said sequence of unary valued control signals, said sum of activated energy sources determining a magnitude of said output signal.

21. The circuit as recited in claim 20 wherein said plurality of energy sources are arranged in a matrix array of rows and columns.

22. The circuit as recited in claim 21, further comprising:

means for dividing said binary input signals into two sub-signals, wherein said converting means operates to convert each of said two sub-signals into two corresponding sub-unary valued control signals, wherein one of said sub-unary valued control signals controls said rows of said matrix array and the other one of said sub-unary valued control signals controls said columns of said matrix array.

23. The circuit as recited in claim 20 wherein at least one of said energy sources is always activated during operation of said circuit, except during conversion of an input signal that has a zero value.

24. The circuit as recited in claim 20 wherein said circuit is a DAC.

25. The circuit as recited in claim 20 wherein said binary input signals and said output signal are video signals.

26. The circuit as recited in claim 20 wherein said energy sources are current sources.

27. The circuit as recited in claim 20 wherein said converting means is a decoder.

28. A DAC for monotonically translating adjacent digital signals within a received sequence of digital input signals into analog signals, said DAC comprising:

means for dividing each of said adjacent digital signals into most significant bits and least significant bits;

means including a shifting array for converting in a predetermined manner said most significant bits and said least significant bits of each of said adjacent digital signals into unary valued control signals;

means for activating a matrix array of energy sources, said matrix array arranged in rows and columns, wherein said unary valued control signals representing said most significant bits controlling activation of said rows and said unary valued control signals representing said least significant bits controlling activation of said columns, and wherein an energy source within said matrix array is activated when said row and said column corresponding to said energy source are both activated by their corresponding unary valued control signals;

means for outputting a sum of said activated energy sources for each set of unary valued control signals, said sum establishing said analog signals; and means for monotonically varying said sum of activated energy sources during a transition period between adjacent signals.

29. A circuit for converting a received n-bit digital signal into a monotonic output analog signal, said circuit comprising:

means for dividing said n-bit digital signal into two (n/2)-bit signals;

means including a shifting array for decoding each of said two (n/2)-bit signals into first and second m-bit unary valued control signals, said first M-bit unary valued control signal representing MSB bits of said n-bit digital signal and said second m-bit unary valued control signal representing LSB bits of said n-bit digital signal;

a matrix array of current sources arranged in rows and columns, wherein each of said rows is controlled by one of said MSB bits and each of said columns are controlled by one of said LSB bits, and wherein one of said current sources is activated when its corresponding row and column are both enabled by their associated MSB and LSB bits, respectively; and means for summing currents produced by actuated current sources, said output analog signal equal to said summed currents.

30. The circuit as recited in claim 29 wherein an entire row of said current sources is activated when a high signal is presented by an adjacent MSB bit.

31. The circuit as recited in claim 29 wherein said digital signal is a video signal.

32. The circuit as recited in claim 29 wherein each said shifting array includes a plurality of (n/2)-bit multiplex circuits connected in common with one of said (n/2)-bit signals.

33. A method for providing a monotonic output signal as a function of an input signal value, said method comprising the steps of:

dividing said input signal into a plurality of binary valued control signals, converting said binary control signals by passing said binary bits through a shifting array into two unary valued control signals, each of said unary valued control signals containing a plurality of binary bits, a combination of said bits of each of said unary control signals operable for controlling said output signal; and establishing said output signal under control of combinations of said plurality of unary valued control signals.

34. The method set forth in claim 33 wherein said establishing step utilizes energy providing sources arranged in a matrix, said method further comprising the steps of:

controlling rows of said matrix with one of said unary valued control signals; and controlling columns of said matrix with another of said unary valued control signals, wherein a number of energy providing sources that are enabled at any one time are controlled by a combination of said row and column control signals.

35. The method set forth in claim 34 wherein each of said row and column combination control signals is a coincident "one" condition of both a row and a column control signal and wherein said method further comprises the step of:

maintaining said energy providing sources of a certain row of said matrix in their enabled condition regardless of a status of said LSB representative bits.

36. The method set forth in claim 33 wherein said one of said unary valued control signals represents MSB bits of said input signal while said another of said unary valued control signals represents LSB bits of said input signal.

37. The method set forth in claim 33 wherein said energy providing sources are current sources.

38. The method set forth in claim 37 wherein said current sources are added together under coincident joint control of said unary valued control signals.

39. The system set forth in claim 38 wherein said current sources are equal in value to each other.

40. The method set forth in claim 33 wherein said energy providing sources are equal in value.

41. The method set forth in claim 33 wherein said energy providing sources are added together under coincident joint control of said unary valued control signals.

42. A method for converting a multibit digital input signal into a monotonic output analog signal, said method comprising the steps of:

transforming said multibit digital input signal into a proportional multibit unary valued control signal, wherein a number of "high" bits within said multibit unary valued control signal is proportional to said multibit digital input signal, said transforming step including the step of shifting bits of said input signal through a shifting array; and controlling activation of individual current sources arranged in rows and columns of a matrix array with said multibit unary valued control signal, wherein a number of activated current sources is a function of said multibit unary valued control signal, and wherein a sum of said activated current sources establishes said output analog signal, said current sources being of equal values.

43. The method as recited in claim 42, further comprising the step of:

dividing said multibit digital input signal into MSB and LSB bits, wherein one portion of said multibit unary valued control signal represents said MSB bits and another portion of said multibit unary valued control signal represents said LSB bits, and wherein said MSB bits control said rows and said LSB bits control said columns.

44. The method as recited in claim 43 wherein a combination of said MSB bits and said LSB bits operate to control activation of said current sources, and wherein said method further comprises the step of:

maintaining activation of said current sources within a certain row regardless of a status of said row's associated LSB bits.

45. A method for providing a monotonic output signal as a function of an input signal value, said method comprising the steps of:

dividing said input signal into a plurality of unary valued control signals, each of said unary valued control signals containing a plurality of binary bits, a combination of said bits of each of said unary control signals operable for controlling said output signal said transforming step including the step of shifting bits of said input signal through a shifting array;

controlling rows within a matrix of equal value current sources with one of said unary valued control signals, wherein said one of said unary valued control signals represents MSB bits of said input signal; and controlling columns of said matrix with another of said unary valued control signals, wherein said another of said unary valued control signals represents LSB bits of said input signal, wherein a number of equal value current sources that are enabled at any one time are controlled by a combination of said row and column control signals.

46. The method set forth in claim 45 wherein each of said row and column combination control signals is a coincident "one" condition of both a row and a column control signal and wherein said method further comprises the step of:

maintaining said current sources of a certain row of said matrix in their enabled condition regardless of a status of said LSB representative bits.

47. The method set forth in claim 46 wherein said current sources are added together under coincident joint control of said unary valued control signals.

* * * * *